(12) United States Patent
Shuai et al.

(10) Patent No.: US 7,423,873 B2
(45) Date of Patent: Sep. 9, 2008

(54) HEAT DISSIPATION DEVICE HAVING FAN HOLDER FOR ATTACHMENT OF A FAN

(75) Inventors: Chun-Jiang Shuai, Shenzhen (CN); Cui-Jun Lu, Shenzhen (CN); Yong Zhong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 69 days.

(21) Appl. No.: 11/309,757

(22) Filed: Sep. 22, 2006

(65) Prior Publication Data
US 2008/0074843 A1    Mar. 27, 2008

(51) Int. Cl.
*H05K 7/20* (2006.01)
*H01L 23/36* (2006.01)

(52) U.S. Cl. .................. 361/697; 361/695; 361/709; 361/710; 165/80.3; 165/104.33; 165/185

(58) Field of Classification Search ......... 361/690–697, 361/703–712, 717–719; 165/80.2, 80.3, 165/185, 121–126, 104.33; 174/16.3, 15.2; 257/718–719, 722, 726, 727; 24/453, 457, 24/458; 248/505, 510
See application file for complete search history.

(56) References Cited

U.S. PATENT DOCUMENTS

| | | | | |
|---|---|---|---|---|
| 6,654,246 B2 * | 11/2003 | Wu | ............................ | 361/697 |
| 6,667,884 B1 * | 12/2003 | Lee et al. | ..................... | 361/697 |
| 6,816,373 B2 * | 11/2004 | Lee et al. | ..................... | 361/697 |
| 6,973,962 B2 * | 12/2005 | Hwang et al. | .............. | 165/80.3 |
| 7,269,010 B2 * | 9/2007 | Yu et al. | ..................... | 361/697 |
| 7,289,322 B2 * | 10/2007 | Chen et al. | .................. | 361/695 |

* cited by examiner

*Primary Examiner*—Michael V Datskovskiy
(74) *Attorney, Agent, or Firm*—Frank R. Niranjan

(57) ABSTRACT

A heat dissipation device includes a heat sink (10), a fan holder (20) located on the heat sink and a fan (30) mounted on the fan holder. The heat sink includes a plurality of fins (14) extending therefrom and defines two slots (16) in two opposite outmost fins thereof. The fan holder includes two brackets (200) each having a positioning rib (212) engaged in a corresponding slot of the heat sink and resisting the outmost fin to thereby mount the fan holder to the heat sink.

11 Claims, 3 Drawing Sheets

HEAT DISSIPATION DEVICE HAVING FAN HOLDER FOR ATTACHMENT OF A FAN

FIELD OF THE INVENTION

The present invention relates generally to a heat dissipation device, and more particularly to a heat dissipation device incorporating a fan for dissipating heat generated by an electronic device. The heat dissipation device has a fan holder for attachment of the fan.

DESCRIPTION OF RELATED ART

It is well known that during operation computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is desired to provide forced airflow to the heat sink. Usually, the fan is mounted to the heat sink by a fan holder attached to the heat sink. Conventionally, the heat sink mainly comprises a heat-conducting base contacting a heat generating electronic device and a plurality of heat dissipating fins extending from one face of the base. A plurality of screw threads is formed in two outermost fins at each side of the heat sink. The fan holder defines a plurality of fixing apertures corresponding to the screw threads of the heat sink. Pluralities of screws are engaged in the fixing apertures of the fan holder and the screw threads of the heat sink, thereby fastening the fan holder to the heat sink. The fan holder is mounted on the heat sink by using a number of screws. The structure can mount the fan to the heat sink, but a problem is that complexities arise when installing the fan holder to the heat sink using multiple screws.

What is needed, therefore, is a heat dissipation device incorporating a fan holder easily mounted to a heat sink thereof.

SUMMARY OF THE INVENTION

A heat dissipation device in accordance with a preferred embodiment of the present invention includes a heat sink, a fan holder located on the heat sink and a fan mounted on the fan holder. The heat sink includes a plurality of fins extending therefrom and defines two slots in two opposite outmost fins thereof. The fan holder includes two brackets each having a positioning rib engaged in a corresponding slot of the heat sink and resisting the outmost fin to thereby mount the fan holder to the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
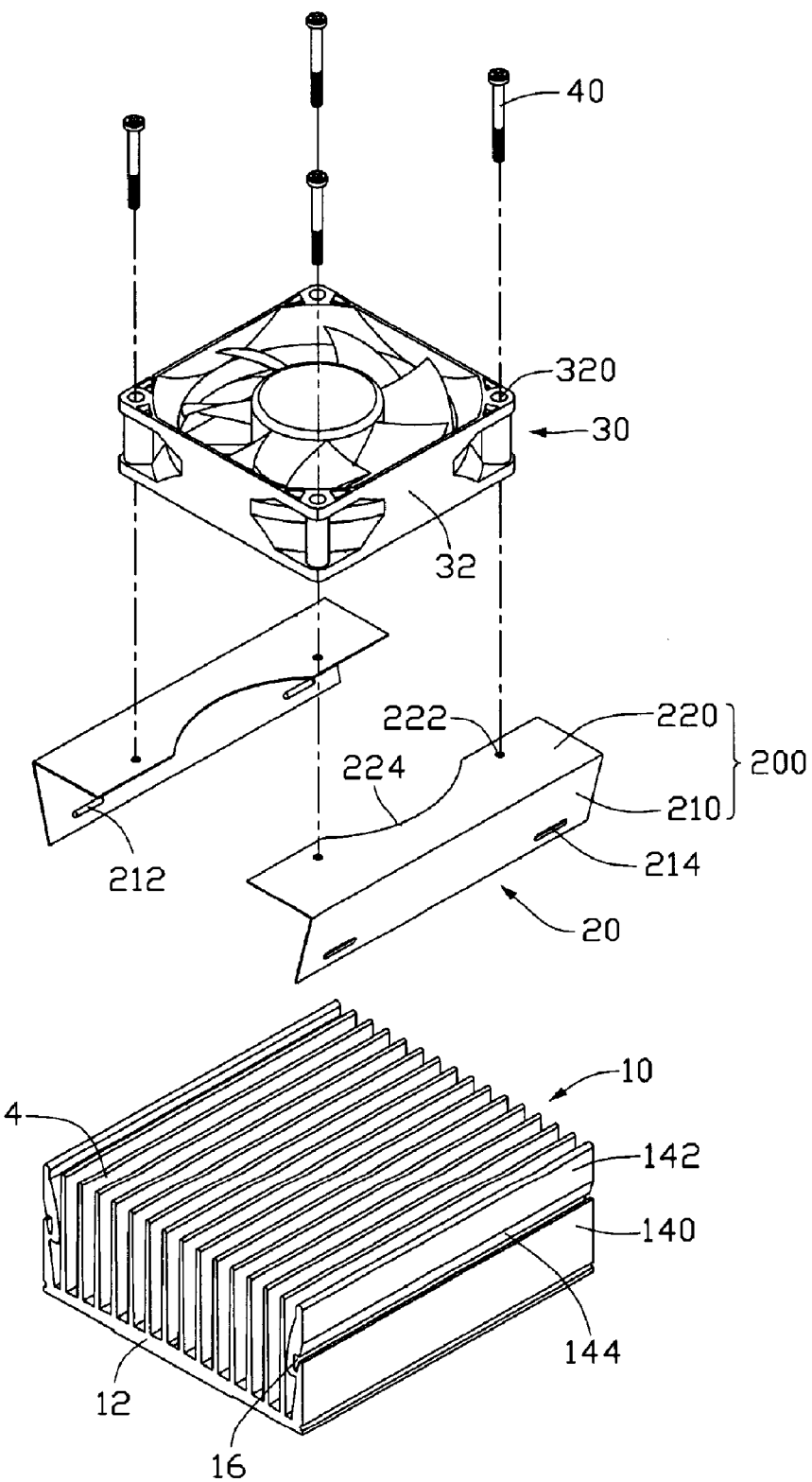
FIG. 1 is an exploded, isometric view of a heat dissipation device in accordance with a preferred embodiment of the present invention.

FIG. 1 illustrates a heat dissipation device in accordance with a preferred embodiment of the present invention. The heat dissipation device comprises a heat sink 10, a fan holder 20 and a fan 30 mounted on the fan holder 20.

The heat sink 10 is integrally extruded from heat conductive material, such as aluminum, and comprises a base 12 and a plurality of fins 14 perpendicularly extending from the base 12. The base 12 has a bottom face (not labeled) for contacting a heat-generating electronic device such as a CPU (not shown). A pair of slots 16 are defined in outer surfaces of two opposite outmost fins 14 of the heat sink 10, respectively. Each of the two opposite outmost fins 14 comprises a first portion 140 extending upwardly from the base 12 and a second portion 142 extending upwardly from a lateral side of the first portion 140. The first portion 140 has a gradually decreasing thickness toward a top of the first portion 140 away from the base 12. The slot 16 is defined when the second portion 142 is recessed in a connecting portion (not labeled) between the first portion 140 and the second portion 142. Seen from a direction of a lateral side view (i.e., FIG. 2) of the heat sink 10, the second portion 142 has an ear-like shape. The second portion 142 has an inclined surface 144 corresponding to a top end (not labeled) of the first portion 140, for facilitating an engagement with the fan holder 20. The inclined surface 144 extends upwardly and outwardly along a bottom-to-top direction of the heat sink 10. The top end of the first portion 140 is located outside of and adjacent to the slot 16.

The fan holder 20 comprises a pair of brackets 200 attached on a top of the heat sink 10. Each bracket 200 comprises a first plate 210 arranged at a lateral side of the heat sink 10 and a second plate 220 connecting with the first plate 210 and attached to the top of the heat sink 10. The first plate 210 has a rectangular shape and has a pair of positioning ribs 212 perpendicularly inwardly protruding from an inner side (not labeled) thereof. The positioning ribs 212 are stamped from the first plate 210 so that a pair of recesses 214 are defined in an opposing outer side (not labeled) of the first plate 210, located corresponding to the positioning ribs 212. A pair of threaded holes 222 are defined in opposing lateral edges of the second plate 220. The second plate 220 has an arc-shaped side edge 224 between the threaded holes 222. The arc-shaped side edges 224 of the second plates 220 of the brackets 200 together define a round opening (not labeled) below the fan 30, for guiding airflow produced by the fan 30 to pass through to cool the fins 14 of the heat sink 10. The fan 30 comprises a rectangular frame 32. The frame 32 defines four orifices 320 in four corners corresponding to the threaded holes 222 of the second plates 220 of the brackets 200 of the fan holder 20.

Figure 2:
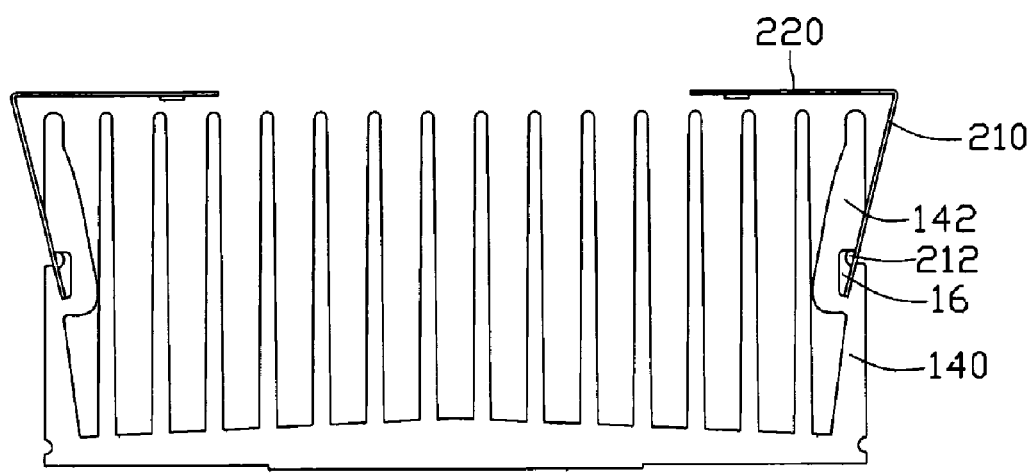
FIG. 2 is an assembled side view of a fan holder and a heat sink of the heat dissipation device of FIG. 1.

Referring to FIG. 2, in order to assemble the fan holder 20 to the heat sink 10, bottoms of the first plates 210 of the brackets 200 of the fan holder 20 are slipped over the inclined surface 144 and inserted into the slots 16 of the opposite outmost fins 14 of the heat sink 10. The positioning ribs 212 of the first plates 210 of the brackets 200 are held in the slots 16 and resist the second portion 142 of the outmost fin 14. The positioning ribs 212 abut against a bottom surface (not labeled) of the second portion 142 of the outmost fin 14, which is extended inwardly from a bottom end of the inclined surface 144. The first plate 210 has an outer surface at a lower end thereof, which abuts against the top end of the first portion 140, and an inner surface above the position ribs 212, which abut against the inclined surface 144.

Figure 3:
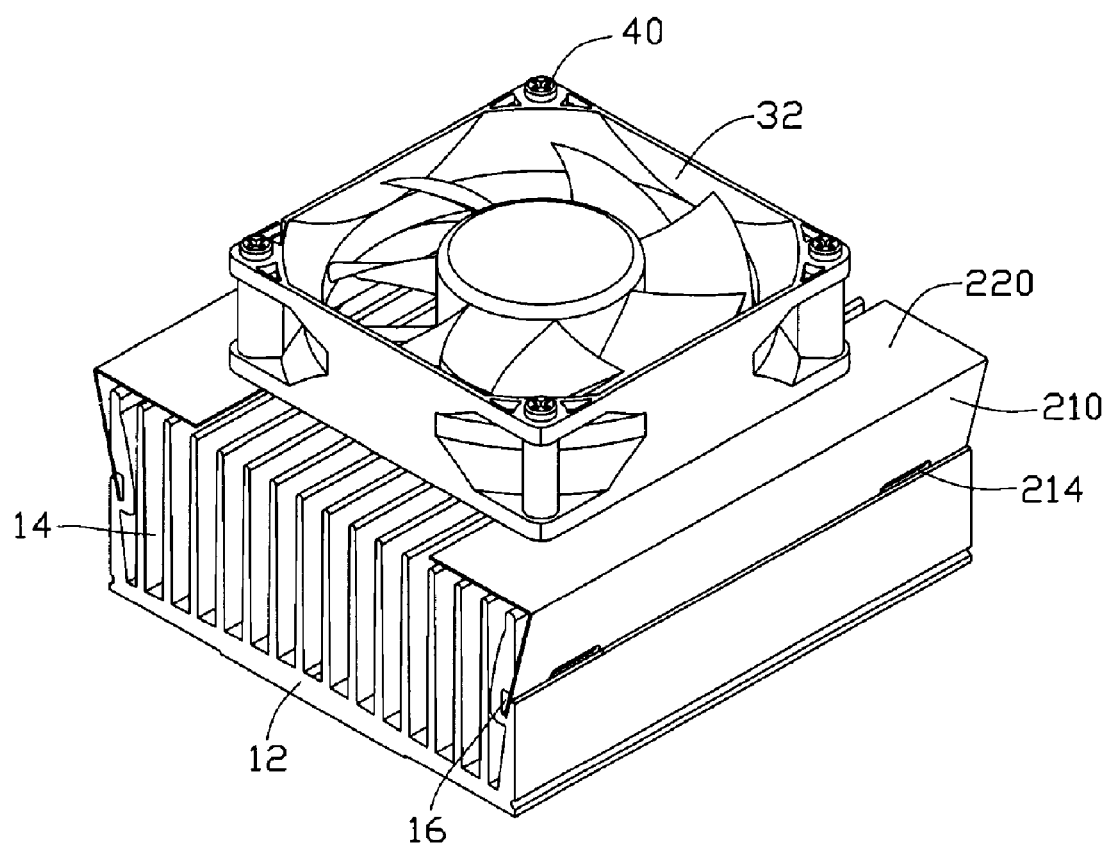
FIG. 3 is an assembled view of FIG. 1.

Referring to FIGS. 1-3, the second plates 220 of the brackets 200 of the fan holder 20 are located on the top of the heat sink 10 and the fan 30 is arranged on the brackets 200 of the fan holder 20. Four screws 40 are extended through the orifices 320 of the frame 32 and screwed in the threaded holes 222 of the second plates 220 of the brackets 200 to thereby fasten the fan 30 to the top of the heat sink 10, with the airflow produced by the fan 30 passing through the opening (not labeled) of the fan holder 20 to cool the fins 14 of the heat sink 10.

In this case, the fan holder 20 can be made by steel instead of aluminum and surfaces of the fan holder 20 are coated with zinc so that the fan holder 20 has advantages of better strength and low cost.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat dissipation device comprising:
a heat sink comprising a base for contacting a heat generating device, and a plurality of fins extending from the base, two slots being defined in two opposite outmost fins of the heat sink;
a fan holder secured on the heat sink, the fan holder having two brackets comprising two first plates engaging in the slots of the heat sink and fixing the fan holder on the heat sink, each first plate having a positioning rib blocked in a corresponding slot of the heat sink and the positioning rib resisting a corresponding outmost fin of the heat sink; and
a fan being located on the fan holder;
wherein each of the two opposite outmost fins comprises a first portion extending from the base and a second portion extending from a lateral side of the first portion, the slot being defined between the first portion and the second portion.

2. The heat dissipation device of claim 1, wherein each of the brackets comprises a second plate connecting with the first plate and located to a top of the heat sink.

3. The heat dissipation device of claim 2, wherein the second plate defines a pair of threaded holes in a side thereof corresponding to orifices defined in the fan, screws being extended through the orifices of the fan and screwed in the threaded holes of the second plates.

4. The heat dissipation device of claim 1, wherein the positioning rib is stamped from the first plate and a recess is defined in the first plate corresponding to the positioning rib.

5. A heat dissipation device comprising:
a heat sink comprising a base and a plurality of fins extending from the base, two slots being defined in two opposite lateral sides of the heat sink;
a fan holder comprising two brackets secured on the two opposite lateral sides of the heat sink, each bracket comprising a positioning rib fitted into a corresponding slot of the heat sink and the positioning ribs abutting against the lateral sides for thereby fixing the fan holder to the heat sink; and
a fan mounted on the fan holder;
wherein the heat sink comprises two opposite outmost fins at the two opposite lateral sides thereof, each of the outmost fins comprises a first portion extending from the base and a second portion extending from a lateral side of the first portion, the slots are defined in the second portions.

6. The heat dissipation device of claim 5, wherein each of the brackets comprises a first plate and a second plate extending from the first plate and located on top of the heat sink, the positioning rib being formed from the first plate and abutting against one of the outmost fins of the heat sink.

7. The heat dissipation device of claim 6, wherein the fan is fastened to second plates of the brackets by extending screws through the fan and screwed in the second plates of the brackets.

8. A heat dissipation device comprising:
a heat sink having a base adapted for contacting with a heat-generating electronic component, and a plurality of fins extending upwardly from the base, the fins comprising two outermost fins each having a first portion extending upwardly from the base and a second portion extending upwardly from an inner side of the first portion, a slot exposed outwardly being defined in the second portion;
a bracket having a first plate slantwise inserted into the slot and a second plate extending from a top end of the first plate to a position over a top of the heat sink, wherein the first plate has a rib formed thereon, the rib abutting against a bottom surface of the second portion of said each outermost fin to thereby secure the bracket to the heat sink; and
a fan mounted on the second plate of the bracket.

9. The heat dissipation device of claim 8, wherein the first portion has a top end positioned outside of and adjacent to the slot.

10. The heat dissipation device of claim 9, wherein the second portion has an inclined surface extending upwardly and outwardly from the bottom surface of the second portion, the first plate having an inner surface above the rib, which abuts against the inclined surface.

11. The heat dissipation device of claim 10, wherein the first plate has a lower end with an outer surface abutting against the top end of the first portion of said each outermost fin.

\* \* \* \* \*